(12) United States Patent  
Kim

(10) Patent No.: US 9,530,484 B1
(45) Date of Patent: Dec. 27, 2016

(54) SEMICONDUCTOR APPARATUS AND SEMICONDUCTOR SYSTEM INCLUDING THE SAME

(71) Applicant: SK hynix Inc., Icheon-si, Gyeonggi-do (KR)

(72) Inventor: Kwi Dong Kim, Icheon-si (KR)

(73) Assignee: SK HYNIX INC., Icheon-Si (KR)

( * ) Notice: Subject to any disclaimer, the term of this patent is extended or adjusted under 35 U.S.C. 154(b) by 0 days.

(21) Appl. No.: 15/044,226

(22) Filed: Feb. 16, 2016

(30) Foreign Application Priority Data

Aug. 31, 2015 (KR) .......................... 10-2015-0122999

(51) Int. Cl.
*G11C 11/4063* (2006.01)
*G11C 11/406* (2006.01)
*G11C 11/4091* (2006.01)
*G11C 11/408* (2006.01)

(52) U.S. Cl.
CPC ...... *G11C 11/40618* (2013.01); *G11C 11/4085* (2013.01); *G11C 11/4087* (2013.01); *G11C 11/4091* (2013.01); *G11C 11/40603* (2013.01)

(58) Field of Classification Search
CPC ...................... G11C 11/40603; G11C 11/40618
USPC ........................................................ 365/222
See application file for complete search history.

(56) References Cited

U.S. PATENT DOCUMENTS

| | | | | |
|---|---|---|---|---|
| 6,028,804 A | * | 2/2000 | Leung | G11C 11/406 365/195 |
| 6,195,303 B1 | * | 2/2001 | Zheng | G11C 11/406 365/222 |
| 8,275,936 B1 | * | 9/2012 | Haywood | G06F 13/1657 365/189.05 |
| 2004/0081006 A1 | * | 4/2004 | Takahashi | G11C 11/406 365/200 |
| 2006/0221746 A1 | * | 10/2006 | Kang | G11C 11/40615 365/222 |
| 2008/0168217 A1 | * | 7/2008 | Vogelsang | G11C 11/406 711/106 |
| 2009/0238015 A1 | * | 9/2009 | Yeol Yang | G11C 8/12 365/194 |
| 2014/0185352 A1 | * | 7/2014 | Chow | G11C 11/408 365/63 |

FOREIGN PATENT DOCUMENTS

KR               100267834 B1      7/2000

* cited by examiner

*Primary Examiner* — Hoai V Ho
*Assistant Examiner* — Jay Radke
(74) *Attorney, Agent, or Firm* — William Park & Associates Ltd.

(57) ABSTRACT

A semiconductor apparatus includes a plurality of unit memory blocks and a plurality of sense amplifier arrays configured to be shared with two or more unit memory blocks among the plurality of unit memory blocks, and amplify data of the unit memory blocks. When a unit memory block corresponding to an external address and a unit memory block corresponding to a refresh address among the plurality of unit memory blocks are coupled in common to one of the plurality of sense simplifier arrays, the semiconductor apparatus stores the refresh address and executes a normal operation command corresponding to the external address.

18 Claims, 8 Drawing Sheets

SEMICONDUCTOR APPARATUS AND SEMICONDUCTOR SYSTEM INCLUDING THE SAME

CROSS-REFERENCES TO RELATED APPLICATION

This application claims priority under 35 U.S.C. 119(a) to Korean application No. 10-2015-0122999 filed on Aug. 31, 2015, in the Korean intellectual property Office, which is incorporated herein by reference in its entirety.

BACKGROUND

1. Technical Field

The inventive concept generally relates to an integrated circuit, and more particularly to a semiconductor apparatus and a semiconductor system including the same.

2. Related Art

A refresh operation of a semiconductor apparatus involves periodically reading information from an area of the semiconductor apparatus and immediately rewriting the read information to the same area for the purpose of preserving the information. The semiconductor apparatus may have a function that autonomously performs the refresh operation without control by an external apparatus such as a memory controller coupled to the semiconductor apparatus.

Some types of memory chips may perform a refresh operation not only automatically (e.g., self refresh) but also by being controlled by the controller (e.g., auto refresh).

When the refresh operation of the memory chip is not controlled by the controller, there may be a conflict between an external address, which is provided with an external command (i.e., a command output from the controller), and a refresh address, which is generated inside the memory chip. When using sense amplifiers, there may also be a conflict between a refresh operation being performed automatically and another operation being performed by the external command.

SUMMARY

One or more example embodiments are provided of a semiconductor apparatus and a semiconductor system capable of efficiently performing an internal refresh operation such as a self refresh operation even when an external command is input.

According to an embodiment, there is provided a semiconductor apparatus. The semiconductor apparatus may include a plurality of unit memory blocks; and a plurality of sense amplifier arrays configured to be shared with at least two or more unit memory blocks among the plurality of unit memory blocks, and to sense-amplify data of the shared unit memory blocks. When a unit memory block corresponding to an external address and a unit memory block corresponding to a refresh address among the plurality of unit memory blocks are commonly coupled to any one of the plurality of sense simplifier arrays, the semiconductor apparatus may be configured to store the refresh address and perform a normal operation command corresponding to the external address.

According to an embodiment, there is provided a semiconductor apparatus. The semiconductor apparatus may include a plurality of unit memory blocks; and a plurality of sense amplifier arrays configured to be shared with at least two or more unit memory blocks among the plurality of unit memory blocks, and to sense-amplify data of the shared unit memory blocks. When a unit memory block corresponding to an external address and a unit memory block corresponding to a refresh address having a first value among the plurality of unit memory blocks are commonly coupled to any one of the plurality of sense simplifier arrays, the semiconductor apparatus may be configured to perform a refresh operation by varying the first value to a second value corresponding to a unit memory block coupled to another sense amplifier array among the plurality of sense amplifier arrays.

According to an embodiment, there is provided a semiconductor system. The semiconductor system may include one or more memory chips including a plurality of sense amplifier arrays, which are configured to be shared with at least two or more unit memory blocks among a plurality of unit memory blocks and to sense-amplify data of the shared unit memory blocks, and configured to, when a unit memory block corresponding to an external address and a unit memory block corresponding to a refresh address among the plurality of unit memory blocks are commonly coupled to any one of the plurality of sense simplifier arrays, output an alert signal for informing that a normal operation command corresponding to the external address is unable to be performed; and a controller configured to delay outputting the normal operation command according to the alert signal.

These and other features, aspects, and embodiments are described below in the section entitled "DETAILED DESCRIPTION."

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Figure 1:
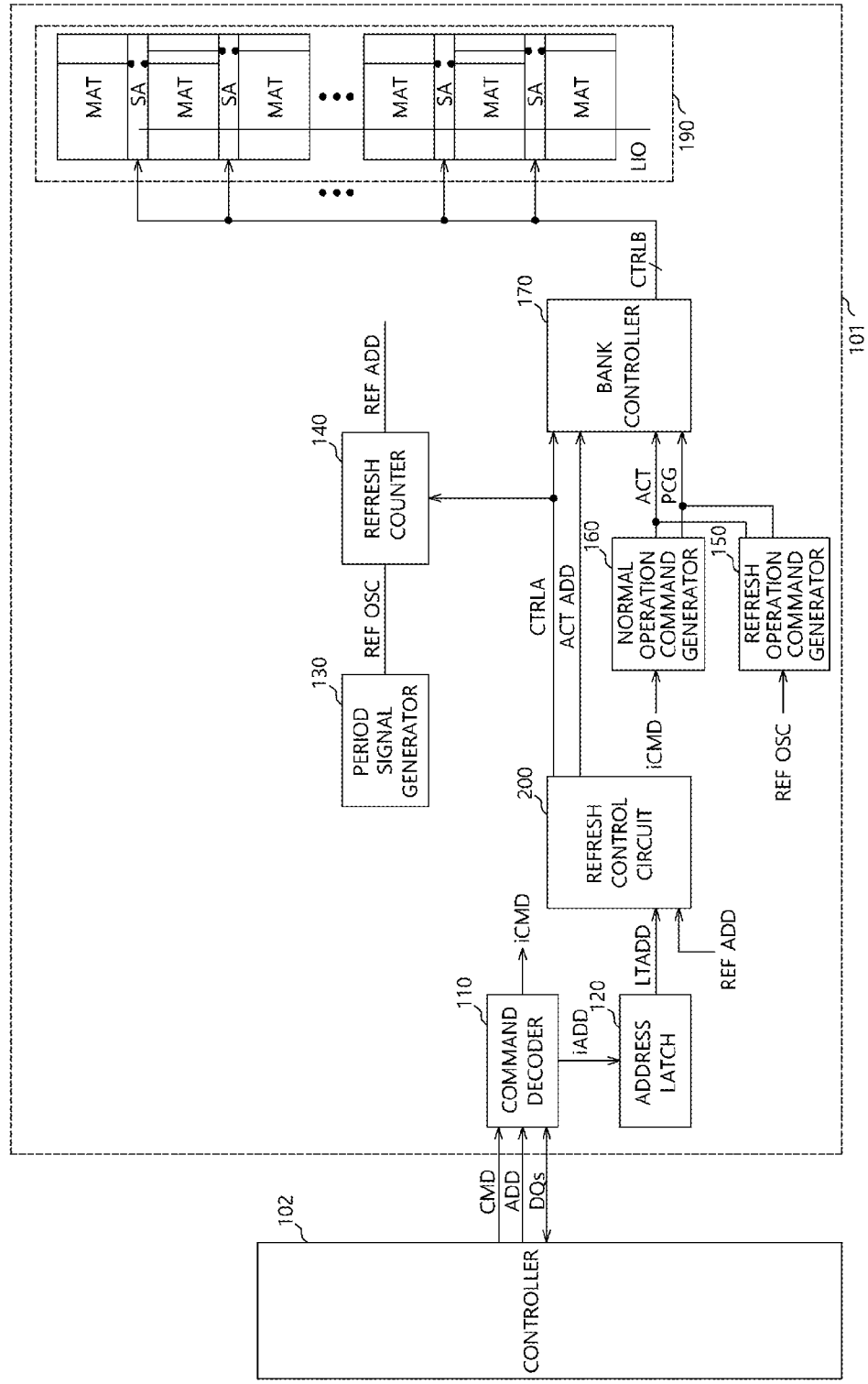
FIG. 1 is a view illustrating an example of a configuration of a semiconductor system according to an embodiment of the inventive concept.

Hereinafter, example embodiments will be described in greater detail with reference to the accompanying drawings. Various embodiments are described herein with reference to cross-sectional illustrations that are schematic illustrations of example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but may be to include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present.

The inventive concept is described herein with reference to cross-section and/or plan illustrations that are schematic illustrations of idealized embodiments of the inventive concept. However, embodiments of the inventive concept should not be construed as limiting to the inventive concept. Although a few embodiments of the inventive concept will be shown and described, it will be appreciated by those of ordinary skill in the art that changes may be made in these example embodiments without departing from the principles and spirit of the inventive concept.

As illustrated in FIG. 1, a semiconductor system 10 according to an embodiment of the inventive concept may include a semiconductor apparatus (e.g., memory chip 101) and a controller (e.g., controller 102).

Examples of the semiconductor system 10 may include system in package (SIP), multi-chip package (MCP), system on chip (SOC), and package on package (POP) including a plurality of packages therein.

The controller 102 may include one or more of a central processing unit (CPU), a graphic processor unit (GPU), a multimedia processor (MMP), and a digital signal processor (DSP).

The controller 102 may provide a command CMD and an address ADD to the memory chip 101 and enable the memory chip 101 to communicate data signals through an input/output terminal DQs.

Hereinafter, for convenience of description, the command CMD and the address ADD will be referred to as an external command CMD and an external address ADD, respectively.

The memory chip 101 may include a plurality of unit memory blocks MAT and a plurality of sense amplifier arrays SA configured to be shared with two or more unit memory blocks among the plurality of unit memory blocks MAT and amplify data of the unit memory blocks MAT. When a unit memory block MAT corresponding to the external address ADD and a unit memory block MAT corresponding to a refresh address REF ADD among the plurality of unit memory blocks MAT are coupled in common to one of the plurality of sense amplifier arrays SA, the memory chip 101 may store the refresh address REF ADD and perform a normal operation command corresponding to the external address ADD in parallel.

The memory chip 101 may include a memory bank 190, a command decoder 110, an address latch 120, a period signal generator 130, a refresh counter 140, a refresh operation command generator 150, a normal operation command generator 160, a bank controller 170, and a refresh control circuit 200.

The memory bank 190 may include the plurality of unit memory blocks MAT and the plurality of sense amplifier arrays SA configured to be shared with two or more unit memory blocks among the plurality of unit memory blocks MAT and amplify data of the unit memory blocks MAT.

The plurality of unit memory blocks MAT may share a local input/output line LIO.

A column-related activation operation in the plurality of sense amplifier arrays SA may be controlled according to a plurality of bank control signals CTRLB.

The command decoder 110 may generate an internal command iCMD by decoding the external command CMD and output the external address ADD corresponding to the external command CMD as an internal address iADD.

The address latch 120 may generate a latch address LTADD by storing the internal address iADD.

The period signal generator 130 may generate a refresh period signal REF OSC in a period according to preset period information. The period signal generator 130 may generate the refresh period signal REF OSC on a regular cycle.

The refresh counter 140 may vary a value of the refresh address REF ADD according to the refresh period signal REF OSC. For example, the refresh counter 140 may continuously change (e.g., increment or decrement) the value of the refresh address REF ADD.

The refresh counter 140 may stop changing the value of the refresh address REF ADD according to a refresh control signal CRTLA.

The refresh operation command generator 150 may generate an active signal ACT and a precharge signal PCG according to the refresh period signal REF OSC.

The normal operation command generator 160 may generate the active signal ACT and the precharge signal PCG according to the internal command iCMD.

The bank controller 170 may generate a plurality of bank control signals CRTLB according to the active signal ACT, the precharge signal PCG, the refresh control signal CRTLA, and an active address ACT ADD.

The bank controller 170 may generate the plurality of bank control signals CTRLB to perform the column-related operation of the sense amplifier arrays SA related to a normal operation according to the active address ACT ADD normally, and, according to the refresh control signal CRTLA, prevent the column-related operation of the sense amplifier arrays SA related to scheduled refresh operations (e.g., a refresh operation that is currently being performed) from being performed.

The refresh control circuit 200 may determine whether or not a value of the latch address LTADD, which is generated from the external address ADD, falls within a preset range set on the basis of a value of the refresh address REF ADD. According to the determination result, the refresh control circuit 200 may also store the refresh address REF ADD, output the latch address LTADD as the active address ACT ADD, and generate the refresh control signal CRTLA.

The process of determining whether or not the value of the latch address LTADD falls within the preset range may determine whether or not the unit memory block MAT corresponding to the external address ADD and the unit memory block corresponding to the refresh address REF ADD among the plurality of unit memory blocks MAT are coupled in common to one of the plurality of sense amplifier arrays SA.

Figure 2:
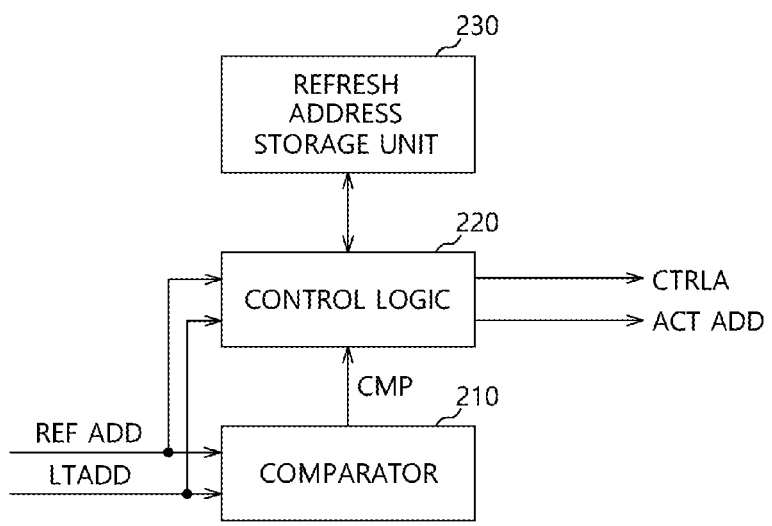
FIG. 2 is a view illustrating an example of a configuration of a refresh control circuit of FIG. 1.

As illustrated in FIG. 2, the refresh control circuit 200 may include a comparator 210, a refresh address storage unit 230, and a control logic 220.

The comparator 210 may generate a comparison result signal CMP by determining whether or not the value of the latch address LTADD falls within the preset range set on the basis of the value of the refresh address REF ADD.

The comparator 210 may compare the value of the refresh address REF ADD with the latch address LTADD while varying the value of the refresh address REF ADD within the preset range, and activate the comparison result signal CMP to, for example, a logic high level if the value of the latch address LTADD falls within the preset range set on the basis of the value of the refresh address REF ADD.

For example, when the comparison result signal CMP is at the logic high level, the control logic 220 may store the refresh address REF ADD in the refresh address storage unit 230, output the latch address LTADD as the active address ACT ADD, and generate the refresh control signal CTRLA.

An operation of the semiconductor system 10 according to the embodiment which has been described with reference to FIGS. 1 and 2 will be described.

First, when it is determined that the unit memory block MAT corresponding to the external address ADD and the unit memory block MAT corresponding to the refresh address REF ADD among the plurality of unit memory blocks MAT are coupled in common to one of the plurality of sense amplifier arrays SA, the semiconductor system 10 may store the refresh address REF ADD that a refresh operation is currently being performed on, temporarily stop generating the value of the refresh address REF ADD by controlling the refresh counter 140, and perform the normal operation according to the external address ADD.

The semiconductor system 10 may perform the normal operation and simultaneously interrupt the column-related operation of the sense amplifier array SA related to the refresh operation.

After the normal operation has been completed, the refresh operation according to the pre-stored refresh address REF ADD may be performed.

Figure 3:
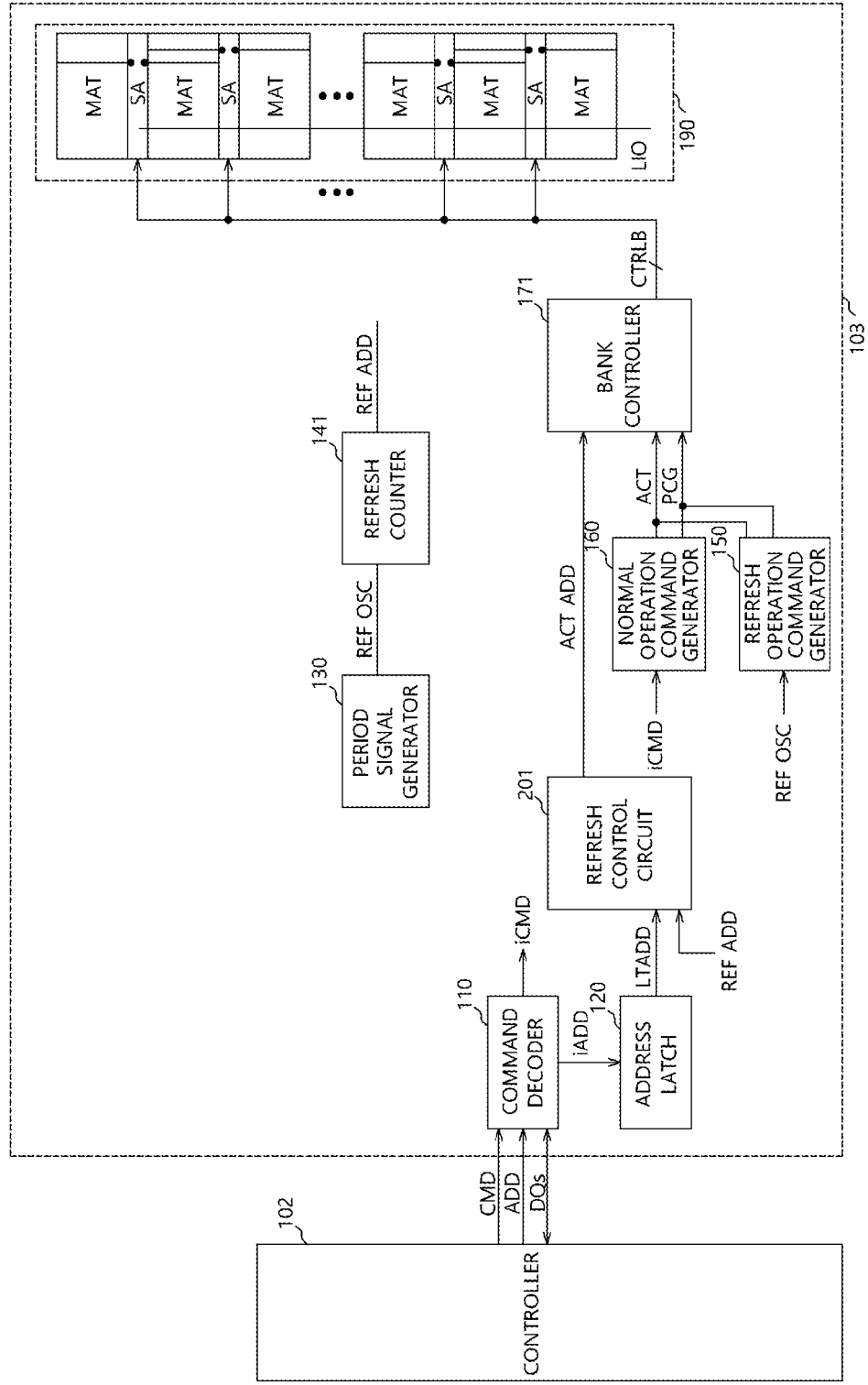
FIG. 3 is a view illustrating an example of a configuration of a semiconductor system according to an embodiment of the inventive concept.

As illustrated in FIG. 3, a semiconductor system 11 according to an embodiment may include a memory chip 103 and a controller 102.

Examples of the semiconductor system 11 may include system in package (SIP), multi-chip package (MCP), system on chip (SOC), and package on package (POP) including a plurality of packages therein.

The controller 102 may have the same configuration as the controller 102 of FIG. 1.

Hereinafter, for convenience of description, the command CMD and the address ADD may be referred to as an external command CMD and an external address ADD, respectively.

The memory chip 103 may include a plurality of unit memory blocks MAT and a plurality of sense amplifier arrays SA configured to be shared with two or more unit memory blocks among the plurality of unit memory blocks MAT and amplify data of the unit memory blocks MAT. When a unit memory block MAT corresponding to the external address ADD and a unit memory block MAT corresponding to a refresh address REF ADD having a first value among the plurality of unit memory blocks MAT are commonly coupled in common to one of the plurality of sense amplifier arrays SA, the memory chip 103 may change the value of the refresh address REF ADD to a second value corresponding to a unit memory block coupled to another sense amplifier array among the plurality of sense amplifier arrays SA and then perform a refresh operation on the changed address.

The memory chip 103 may include a memory bank 190, a command decoder 110, an address latch 120, a period signal generator 130, a refresh counter 141, a refresh operation command generator 150, a normal operation command generator 160, a bank controller 171, and a refresh control circuit 201.

The command decoder 110, the address latch 120, the period signal generator 130, the refresh operation command generator 150, the normal operation command generator 160, and the memory bank 190 may have the same configurations as the command decoder 110, the address latch 120, the period signal generator 130, the refresh operation command generator 150, the normal operation command generator 160, and the memory bank 190 of FIG. 1, respectively.

The refresh counter 141 may vary a value of the refresh address REF ADD according to a refresh period signal REF OSC.

The bank controller 171 may generate a plurality of bank control signals CRTLB according to an active signal ACT, a precharge signal PCG, and an active address ACT ADD.

The refresh control circuit 201 may determine whether or not a value of the latch address LTADD, which is generated from the external address ADD, falls within a preset range set on the basis of the value of the refresh address REF ADD and store the refresh address REF ADD according to the determination result. If the value of the latch address LTADD falls within the preset range, the refresh control circuit 201 may output the value of the latch address LTADD as the active address ACT ADD and change the value of the refresh address REF ADD to a second value corresponding to a unit memory block coupled to another sense amplifier array among the plurality of sense amplifier arrays SA.

The process of determining whether or not the value of the latch address LTADD falls within the preset range may determine whether or not the unit memory block MAT corresponding to the external address ADD and the unit memory block corresponding to the refresh address REF ADD among the plurality of unit memory blocks MAT are coupled to one of the plurality of sense amplifier arrays SA.

Figure 4:
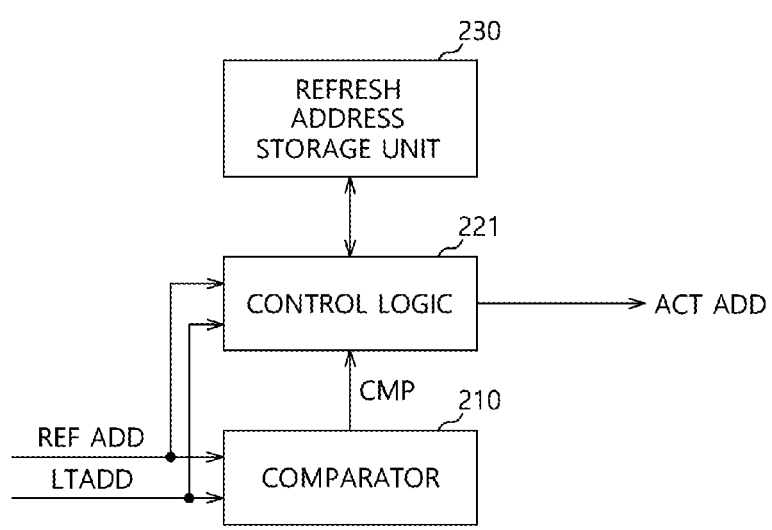
FIG. 4 is a view illustrating an example of a configuration of a refresh control circuit of FIG. 3.

As illustrated in FIG. 4, the refresh control circuit 201 may include a comparator 210, a refresh address storage unit 230, and a control logic 221.

The comparator 210 may generate a comparison result signal CMP by determining whether or not the value of the latch address LTADD falls within the preset range set on the basis of the value of the refresh address REF ADD.

The comparator 210 may compare the value of the refresh address REF ADD with the latch address LTADD while varying the value of the refresh address REF ADD within the preset range, and activate the comparison result signal CMP to, for example, a logic high level if the value of the latch address LTADD falls within the preset range set on the basis of the value of the refresh address REF ADD.

The control logic 221 may periodically store the refresh address REF ADD in the refresh address storage unit 230. The control logic 221 may change the value of the refresh address REF ADD to the second value when the comparison result signal CMP is active (e.g., the logic high level) and then output the changed value of the refresh address REF ADD as the active address ACT ADD.

The control logic 221 may allow the corresponding refresh operation to be performed by outputting the stored refresh address REF ADD as the active address ACT ADD when the comparison result signal CMP is inactive (e.g., a logic low level).

Figure 5:
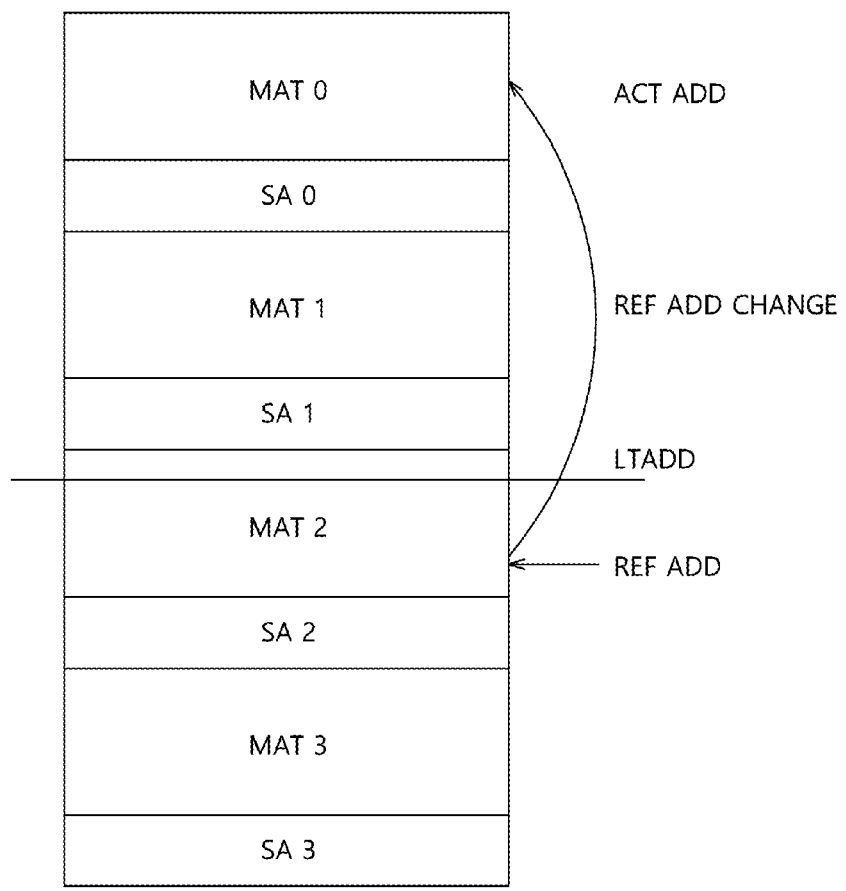
FIG. 5 is a view illustrating an example of a method of changing a value of a refresh address in FIG. 3.

As illustrated in FIG. 5, the latch address LTADD for the normal active operation and the refresh address REF ADD for the refresh active operation may correspond to the same memory block (i.e., a unit memory block MAT2) coupled to the same sense amplifier array SA1, and thus the comparison result signal CMP may become active (e.g., the logic high level).

Accordingly, the control logic 221 may change the value of the refresh address REF ADD to the second value corresponding to a unit memory block MAT0 coupled to another sense amplifier array SA0 and then output the changed refresh address REF ADD as the active address ACT ADD.

An operation of the semiconductor system 11 according to the embodiment which has been described with reference to FIGS. 3 to 5 will be described.

First, when it is determined that the unit memory block MAT corresponding to the external address ADD and the unit memory block MAT corresponding to the refresh address REF ADD among the plurality of unit memory blocks MAT are coupled in common to one of the plurality of sense amplifier arrays SA, the semiconductor system 11 may store the current refresh address REF ADD and simultaneously perform the normal operation and the refresh operation by changing the value of the refresh address REF ADD to the second value.

When the refresh operation is performed after the normal operation has been completed, the refresh operation according to the stored refresh address REF ADD may be performed.

Figure 6:
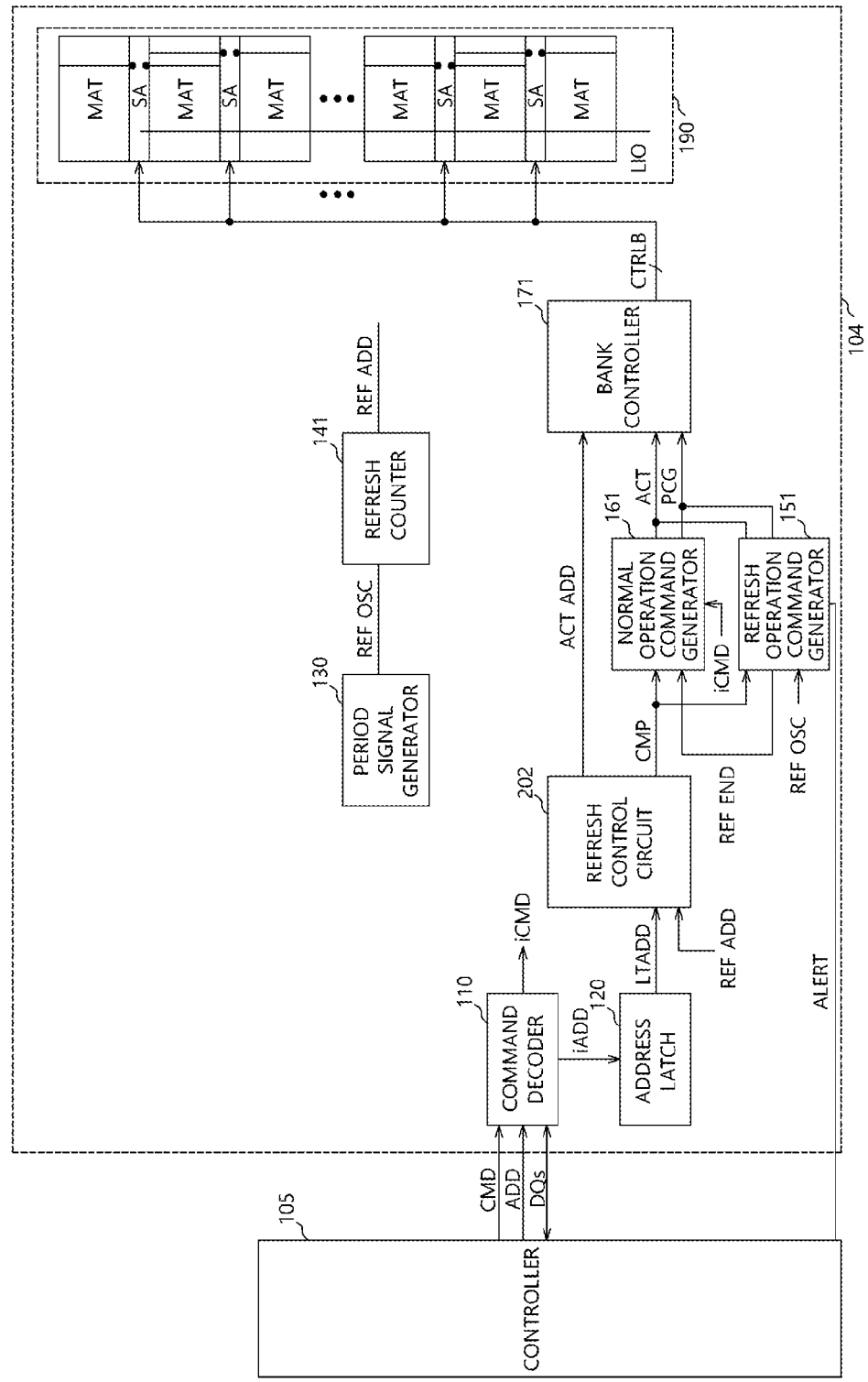
FIG. 6 is a view illustrating a configuration of a semiconductor system according to an embodiment of the inventive concept.

As illustrated in FIG. 6, a semiconductor system 12 according to an embodiment may include a memory chip 104 and a controller 105.

Examples of the semiconductor system 12 may include system in package (SIP), multi-chip package (MCP), system on chip (SOC), and package on package (POP) including a plurality of packages therein.

The controller 105 may provide a command CMD and an address ADD to the memory chip 104 and enable the memory chip 104 to communicate data signals through an input/output terminal DQs.

The controller 105 may control an output of the command CMD (e.g., the normal operation command) to stand by according to an alert signal ALERT transmitted through an alert pin.

When the alert signal ALERT is activated, the controller 105 may recognize that it is difficult for the memory chip 104 to perform an operation according to a command requested by the controller 105. The controller 105 may hold the command CMD, and after the alert signal ALERT is inactivated, the controller 105 may output the command CMD.

Hereinafter, for convenience of description, the command CMD and the address ADD provided from the controller 105 will be referred to as an external command CMD and an external address ADD, respectively.

The memory chip 104 may include a plurality of unit memory blocks MAT and a plurality of sense amplifier arrays SA configured to be shared with two or more unit memory blocks among a plurality of unit memory blocks MAT, and to amplify data of the unit memory blocks MAT. When a unit memory block MAT corresponding to the external address ADD and a unit memory block MAT corresponding to a refresh address REF ADD among the plurality of unit memory blocks MAT are coupled in common to one of the plurality of sense simplifier arrays SA, the memory chip 104 may output the alert signal ALERT for informing that a command corresponding to the external address ADD cannot be performed.

The memory chip 104 may include a memory bank 190, a command decoder 110, an address latch 120, a period signal generator 130, a refresh counter 141, a refresh operation command generator 151, a normal operation command generator 161, a bank controller 171, and a comparison circuit 202.

The command decoder 110, the address latch 120, the period signal generator 130, and the memory bank 190 may have the same configurations as the command decoder 110, the address latch 120, the period signal generator 130, and the memory bank 190 of FIG. 1.

The refresh counter 141 may vary the value of the refresh address REF ADD according to a refresh period signal REF OSC. For example, the refresh counter 141 may continuously change (e.g., increment or decrement) the value of the refresh address REF ADD.

The refresh operation command generator 151 may activate the alert signal ALERT to, for example, a logic low level when a comparison result signal CMP is activated to, for example, a logic high level.

The refresh operation command generator 151 may activate a refresh end signal REF END for informing that the generation of an active signal ACT and a precharge signal PCG and the refresh operation are terminated according to the refresh period signal REF OSC.

The refresh operation command generator 151 may inform the controller 105 that the memory chip 104 can execute the external command CMD by activating the refresh end signal REF END and inactivating the alert signal ALERT simultaneously.

Figure 7:
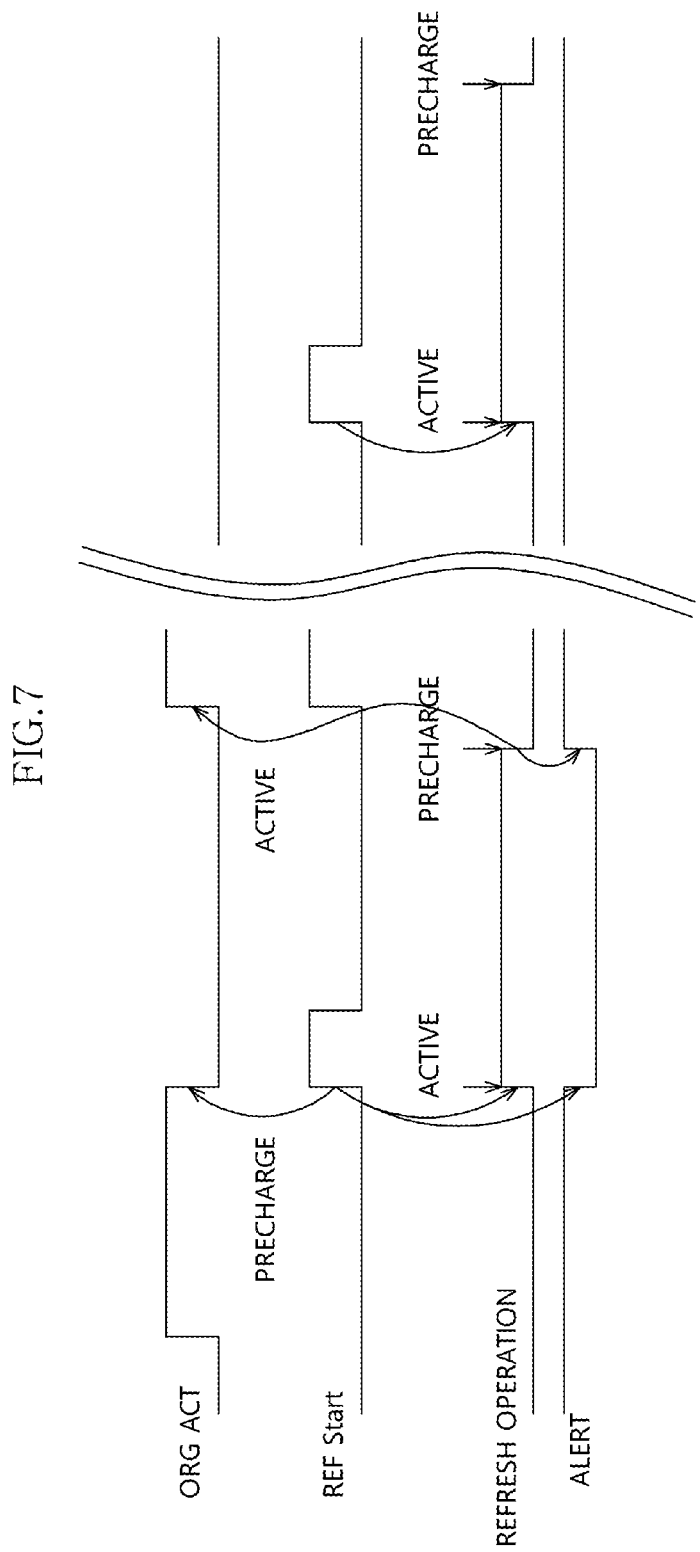
FIG. 7 is a timing diagram explaining an operation of the semiconductor system of FIG. 6.

The refresh operation command generator 151 may generate, using the refresh period signal REF OSC, a refresh start signal REF Start of FIG. 7 which is an internal signal thereof and omitted in FIG. 6.

The normal operation command generator 161 may generate the active signal ACT and the precharge signal PCG according to the internal command iCMD.

When the comparison result signal CMP is at a logic high level, the normal operation command generator 161 may generate the precharge signal PCG for precharging a memory cell of a unit memory block that has been activated according to the internal command iCMD.

When the comparison result signal CMP is inactivated (e.g., the logic low level) and the refresh end signal REF END is activated (e.g., the logic high level), the normal operation command generator 161 may generate the active signal ACT for activating the memory cell which has been being precharged.

The bank controller 171 may generate a plurality of bank control signals CRTLB according to the active signal ACT, the precharge signal PCG, and the active address ACT ADD.

The comparison circuit 202 may determine whether or not a value of the latch address LTADD, which is generated from the external address ADD, falls within a preset range set on the basis of a value of the refresh address REF ADD, and generate the comparison result signal CMP according to the determination result.

The comparison circuit 202 may generate the comparison result signal having the logic high level when the value of the latch address LTADD falls within the preset range set on the basis of the value of the refresh address REF ADD, and generate the comparison result signal CMP having the logic low level when the value of the latch address LTADD falls within the preset range.

The comparison circuit 202 may output the latch address LTADD, which is generated from the external address ADD, as the active address ACT ADD.

The process of determining whether or not the value of the latch address LTADD falls within the preset range may determine whether or not the unit memory block MAT corresponding to the external address ADD and the unit memory block corresponding to the refresh address REF ADD among the plurality of unit memory blocks MAT are coupled in common to one of the plurality of sense amplifier arrays SA.

An operation of the semiconductor system 12 according to the embodiment which has been described with reference to FIGS. 6 and 7 will be described.

First, when it is determined that the unit memory block MAT corresponding to the external address ADD and the unit memory block MAT corresponding to the refresh address REF ADD among the plurality of unit memory blocks MAT are coupled in common to one of the plurality of sense amplifier arrays SA, the memory chip 104 may transmit the alert signal ALERT to the controller 105 through an alert pin by activating the alert signal ALERT (e.g., the logic low level).

The memory chip 104 may activate the alert signal ALERT and simultaneously precharge a memory cell ORG ACT of an originally-activated state, that is, a memory cell activated according to the external command CMD, and perform a refresh operation for a memory cell corresponding to the refresh address REF ADD.

When the refresh operation is terminated, that is, when the refresh end signal REF END is activated, the memory chip 104 may enable the normal operation according to the external command CMD by activating the precharged memory cell again according to the active address ACT ADD.

The memory chip 104 may inform the controller 105 that the command CMD can be performed by activating the refresh end signal REF RND and inactivating the alert signal ALERT.

Figure 8:
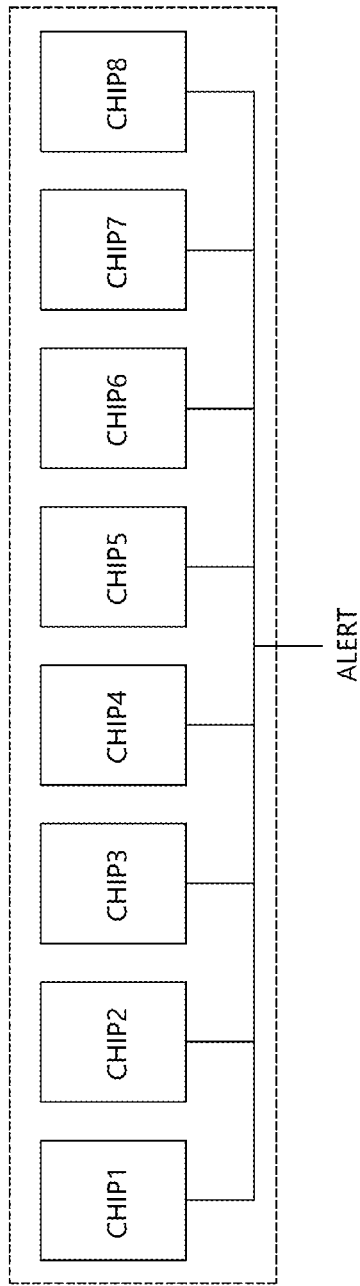
FIGS. 8 and 9 are views illustrating methods of outputting an alert signal in the semiconductor system of FIG. 6.

FIG. 8 illustrates a plurality of memory chips CHIP1 to CHIP 8 sharing an alert pin and outputting the alert signal ALERT.

The alert signal ALERT output from the plurality of memory chips CHIP1 to CHIP 8 may be provided to the controller 105 described with reference to FIG. 6.

The plurality of memory chips CHIP1 to CHIP 8 may have the same configuration as the memory chip 104 of the semiconductor system 12 described in FIG. 6.

Figure 9:
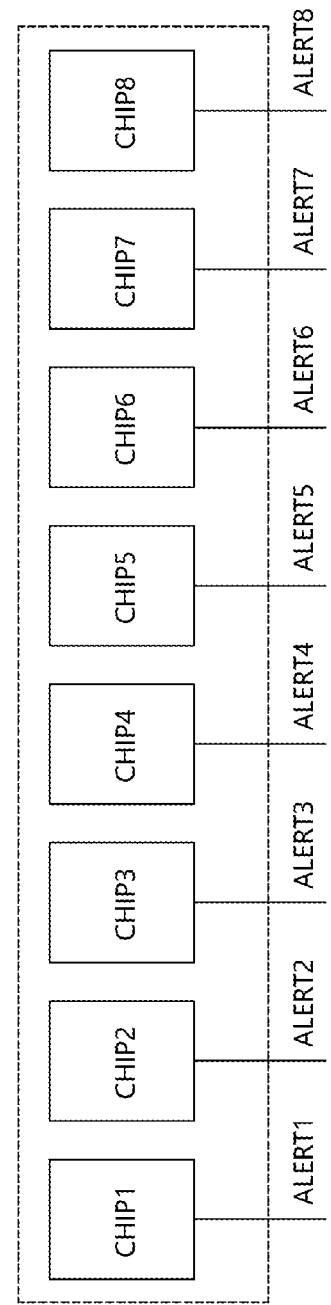

FIG. 9 illustrates a plurality of memory chips CHIP1 to CHIP8 each having an alert pin allocated thereto and outputting each of the alert signals ALERT1 to ALERT8 through each alert pin.

The alert signals ALERT1 to ALERT8 output from the plurality of memory chips CHIP1 to CHIP8 may be provided to the controller 105 described with reference to FIG. 6.

Outputting the alert signals ALERT1 to ALERT8 though individual alert pins may be performed by allocating spare pins among pins coupled between the controller 105 and the memory chip 104 described with reference to FIG. 6 as the alert pins.

The plurality of memory chips CHIP1 to CHIP 8 may have the same configuration as the memory chip 104 of the semiconductor system 12 described in FIG. 6.

In some embodiments, the memory chips 101, 103, and 104 may perform refresh operations not only automatically (e.g., self refresh) but also by being controlled by the controller (e.g., auto refresh). In some other embodiments, the memory chips 101, 103, and 104 may be a memory chip that performs all refresh operations by only a self refresh operation.

The above embodiment of the present invention is illustrative and not limitative. Various alternatives and equivalents are possible. The invention is not limited by the embodiment described herein. Nor is the invention limited to any specific type of semiconductor device. Other additions, subtractions, or modifications are obvious in view of the present disclosure and are intended to fall within the scope of the appended claims.

What is claimed is:

1. A semiconductor apparatus comprising:
    a plurality of unit memory blocks;
    a plurality of sense amplifier arrays configured to be shared with two or more unit memory blocks among the plurality of unit memory blocks and amplify data of the unit memory blocks;
    a refresh counter configured to generate a refresh address, and fix a value of the refresh address according to an activation of a refresh control signal; and
    a refresh control circuit configured to store the refresh address, execute a normal operation command on the unit memory block corresponding to an external address, and activate the refresh control signal, in response to a unit memory block corresponding to the external address and a unit memory block corresponding to a refresh address among the plurality of unit memory blocks being coupled in common to one of the plurality of sense amplifier arrays.

2. The semiconductor apparatus of claim 1, wherein the semiconductor apparatus performs all refresh operations by only a self refresh operation.

3. The semiconductor apparatus of claim 1, wherein the semiconductor apparatus performs a refresh operation according to the stored refresh address after the normal operation command has been completed.

4. The semiconductor apparatus of claim 1, wherein the refresh control circuit comprises:
    a comparator configured to determine whether or not a value of the external address falls within a preset range set on the basis of a value of the refresh address;
    a refresh address storage unit; and
    a control logic configured to, according to an output of the comparator, store the refresh address in the refresh address storage unit, output the external address as an active address, and generate a refresh control signal.

5. The semiconductor apparatus of claim 1, further comprising a bank controller configured to control activation of a sense amplifier array corresponding to the active address among the plurality of sense amplifier arrays and control, according to a refresh control signal, activation of a sense amplifier array related to a refresh operation among the plurality of sense amplifier arrays.

6. The semiconductor apparatus of claim 1, further comprising:
    a command decoder configured to decode an external command;
    a normal operation command generator configured to generate a normal active/precharge command according to an output of the command decoder;
    a refresh operation command generator configured to generate a refresh active/precharge command according to a refresh period signal; and
    a bank controller configured to control the plurality of sense amplifier arrays according to an active address, the normal active/precharge command, and the refresh active/precharge command.

7. A semiconductor apparatus comprising:
    a plurality of unit memory blocks;
    a plurality of sense amplifier arrays configured to be shared with two or more unit memory blocks among the plurality of unit memory blocks and amplify data of the unit memory blocks;
    a refresh counter configured to generate a refresh address; and
    a refresh control circuit configured to store the refresh address having a first value, change the first value to a second value corresponding to a unit memory block coupled to another sense amplifier array among the plurality of sense amplifier arrays and then perform a refresh operation on the second value, in response to a unit memory block corresponding to an external address and a unit memory block corresponding to the refresh address among the plurality of unit memory blocks being coupled in common to one of the plurality of sense amplifier arrays.

8. The semiconductor apparatus of claim 7, wherein the semiconductor apparatus performs all refresh operations by only a self refresh operation.

9. The semiconductor apparatus of claim 7, wherein the semiconductor apparatus stores the first value to perform the refresh operation according to the first value later on.

10. The semiconductor apparatus of claim 7, wherein the refresh control circuit comprises:
 a comparator configured to determine whether or not a value of the external address falls within a preset range set on the basis of the first value;
 a refresh address storage unit; and
 a control logic configured to, according to an output of the comparator, store the refresh address in the refresh address storage unit, change the first value to the second value, and output the changed refresh address as an active address.

11. The semiconductor apparatus of claim 7, further comprising a bank controller configured to control the plurality of sense amplifier arrays according to an active address.

12. The semiconductor apparatus of claim 7, further comprising:
 a command decoder configured to decode an external command;
 a normal operation command generator configured to generate a normal active/precharge command according to an output of the command decoder;
 a refresh operation command generator configured to generate a refresh active/precharge command according to a refresh period signal; and
 a bank controller configured to control the plurality of sense amplifier arrays according to an active address, the normal active/precharge command, and the refresh active/precharge command.

13. A semiconductor system comprising:
 one or more memory chips each including a plurality of sense amplifier arrays configured to be shared with two or more unit memory blocks among a plurality of unit memory blocks and amplify data of the shared unit memory blocks, and configured to, when a unit memory block corresponding to an external address and a unit memory block corresponding to a refresh address among the plurality of unit memory blocks are coupled in common to one of the plurality of sense simplifier arrays, output an alert signal for informing that a normal operation command corresponding to the external address is unable to be performed; and
 a controller configured to delay outputting the normal operation command according to the alert signal,
 wherein each of the memory chips further includes:
 a comparison circuit configured to determine whether or not a value of the external address falls within a preset range set on the basis of a value of an refresh address, output a comparison result signal, and output the refresh address as an active address; and
 a refresh operation command generator configured to generate the alert signal according to the comparison result signal and generate a refresh active/precharge command according to a refresh period signal.

14. The semiconductor system of claim 13, wherein the one or more memory chips share one alert pin and provide the alert signal to the controller through the alert pin.

15. The semiconductor system of claim 13, wherein the one or more memory chips provide alert signals to the controller through individual alert pins.

16. The semiconductor system of claim 13, wherein the one or more memory chips perform all refresh operations by only a self refresh operation.

17. The semiconductor system of claim 13, wherein each of the memory chips further includes a bank controller configured to control the plurality of sense amplifier arrays according to the active address.

18. The semiconductor system of claim 13, wherein each of the memory chips further includes:
 a command decoder configured to decode an external command;
 a normal operation command generator configured to generate a normal active/precharge command according to an output of the command decoder; and
 a bank controller configured to control the plurality of sense amplifier arrays according to the active address, the normal active/precharge command, and the refresh active/precharge command.

* * * * *